United States Patent [19]

Challen et al.

[11] 4,171,516
[45] Oct. 16, 1979

[54] TONE PHASE SHIFT DETECTOR

[75] Inventors: Richard F. Challen, Lynchburg; Terry N. Garner, Forest, both of Va.

[73] Assignee: General Electric Company, Lynchburg, Va.

[21] Appl. No.: 854,060

[22] Filed: Nov. 23, 1977

[51] Int. Cl.$^2$ ............................................. H04B 1/16
[52] U.S. Cl. .................................. 325/466; 324/83 D; 325/478; 328/155
[58] Field of Search .................. 325/64, 348, 466, 478; 324/83 R, 83 D; 307/232, 295; 340/170; 328/155

[56] References Cited

U.S. PATENT DOCUMENTS

| 3,683,345 | 8/1972 | Faulkes et al. | 324/83 D |
| 3,949,301 | 4/1976 | Mattei | 325/348 |
| 3,962,645 | 8/1976 | Stewart | 325/478 |

Primary Examiner—Marc E. Bookbinder
Attorney, Agent, or Firm—James J. Williams

[57] ABSTRACT

The prior art tone detector shown in U.S. Pat. No. 3,962,645 provides a repetitive sequence of vector signals at a predetermined or selected rate determined by the desired tone frequency to be detected. Each vector in the sequence has a different phase or angular direction. One vector in each sequence is selected at a time corresponding to a selected (usually zero) point in each cycle of received tone frequency. If the sum of a number of selected vectors exceeds a threshold, an indication of the desired tone is provided.

In some tone detectors a phase shift in the tone can indicate a selected condition. Such a phase shift is detected by counting the number of vectors which are produced after the phase shift, whose magnitude added to the magnitude of the vectors produced before the phase shift exceeds a threshold, and whose sign differs from the sign of the vectors produced before the phase shift. When the count reaches a predetermined number, a phase shift indication is provided.

11 Claims, 7 Drawing Figures

TONE PHASE SHIFT DETECTOR

BACKGROUND OF THE INVENTION

Our invention relates to a phase shift detector, and particularly to such a detector for detecting the phase shift in a tone transmitted in a radio communication system.

In some frequency modulation radio communication systems, a tone of audio frequency (usually below the voice frequencies) is transmitted to activate only a selected receiver or receivers, and thus provide privacy for the selected receiver or receivers, and prevent interference to other receivers during the transmission. This arrangement is sometimes referred to as a continuous tone controlled squelch system (hereafter CTCSS) or a channel guard system. If the transmitted radio frequency carrier is cut off when the transmission ends (by unkeying the microphone) then a burst or tail of noise will be heard at the activated receiver until the receiver noise squelch circuit takes over and mutes the receiver. In order that this tail of noise be blocked or eliminated, some frequency modulation communication systems use an arrangement that continues transmission of the carrier for a short period (such as 175 milliseconds) after the microphone is unkeyed. During this period while the carrier continues to be transmitted, the phase of the tone is shifted. Detection of this phase shift is necessary in order to deactivate the receiver during the short period that the carrier is still transmitted, so that no noise will be heard when the carrier is finally terminated.

Accordingly, a primary object of our invention is to provide a new and improved tone phase shift detector.

Another object of our invention is to provide a new and improved phase shift detector for use with CTCSS radio receivers.

Phase shift detectors for CTCSS radio receivers have been provided. Typically, such detectors used an electronic circuit tuned to the frequency of the tone to which the receiver was to respond. While the tone was received, the tuned circuit produced an output whose magnitude depended upon how close the transmitted tone frequency and the resonant frequency of the tuned circuit were to each other. Typically, the two frequencies could differ by a substantial amount, either as a result of the tone frequency being incorrect, or as a result of the tuned circuit resonant frequency being incorrect. If the relative difference in the two frequencies was as much as only 0.5 percent, detection of the phase shift became difficult or unreliable.

Accordingly, another object of our invention is to provide a tone phase shift detector that provides an improved or good indication of phase shift, despite relatively large differences in the frequency of the transmitted tone and the frequency to which the electronic circuit is tuned.

Another problem in detecting a tone phase shift results from the fact that the communication medium, or noise, or some other factor may cause voltages or signals to be received that could appear as though the transmitted tone has undergone a phase shift.

Accordingly, another object of our invention is to provide a new and improved tone phase shift detector that is relatively immune from noise and other factors present in a communication system.

Prior art U.S. Pat. No. 3,962,645 shows a circuit for detecting tone frequencies in a CTCSS receiver.

Accordingly, a fairly specific object of our invention is to provide a tone phase shift detector for use with the circuit shown in U.S. Pat. No. 3,962,645.

SUMMARY OF THE INVENTION

Briefly, these and other objects are achieved in accordance with our invention by a phase shift detector which utilizes vector signals produced by a prior art frequency detector. In the prior art detector, the phase or angular direction of the vector signals indicates the frequency of tone received. If the tone frequency corresponds to the rate at which the vector signals are produced, each produced vector signal has the same phase or angular direction, and their magnitude adds rapidly to a threshold that indicates the presence of the desired tone frequency. Our detector uses the average magnitude and angular direction of vectors produced prior to a tone phase shift, and adds and compares those vectors with the magnitude and the angular direction of vectors produced after a tone phase shift. If the added magnitudes are sufficiently high, and if the compared angular directions are sufficiently different, then an indication of tone phase shift is provided. Our detector is relatively immune to noise, interference, and fairly large differences between the transmitted tone frequency and the resonant tone frequency of the receiver.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

DESCRIPTION OF THE PREFERRED EMBODIMENT

Prior Art

Figure 1:
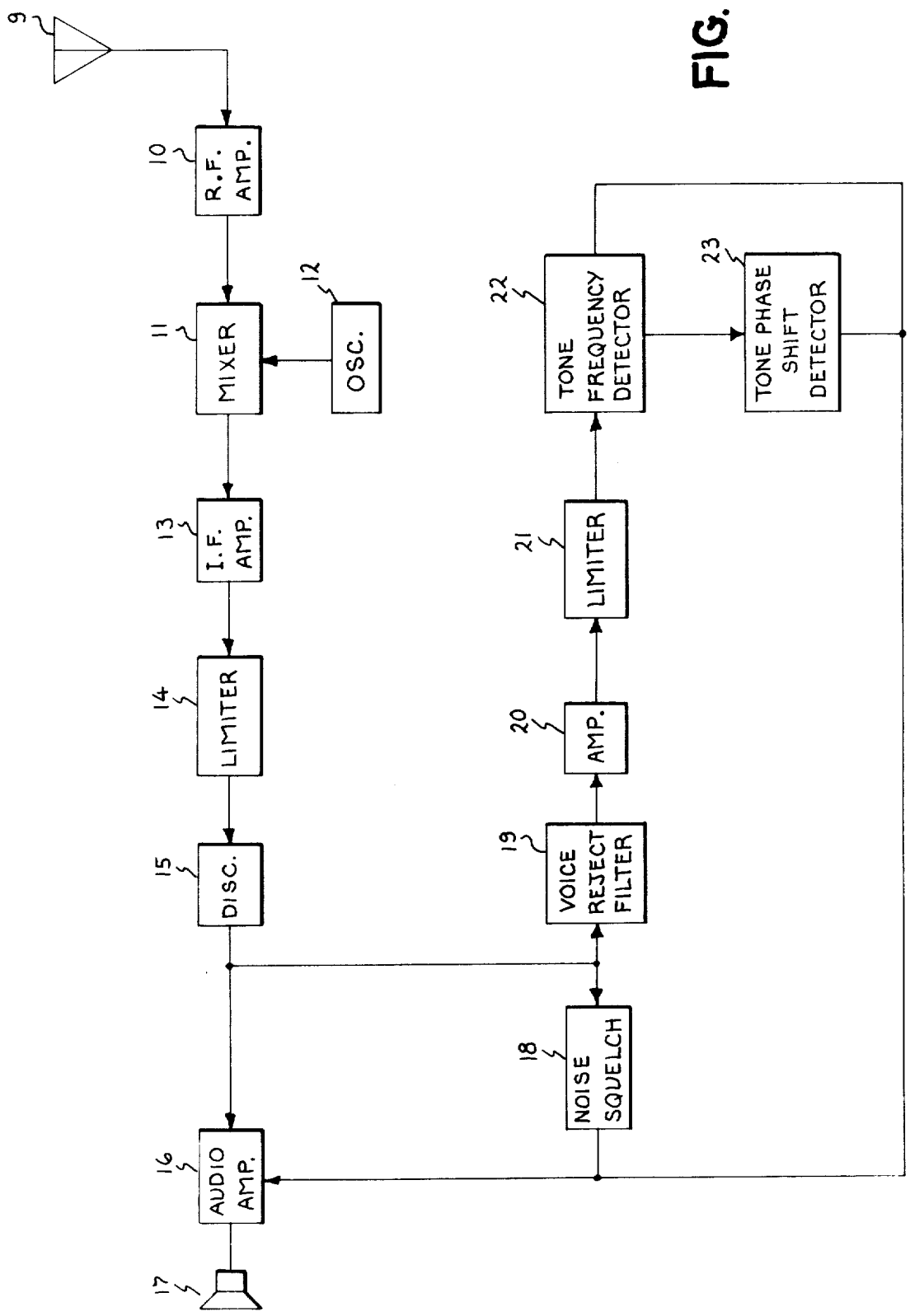
FIG. 1 shows a block diagram of a known radio receiver that is provided with an improved tone phase shift detector in accordance with our invention.

FIG. 1 shows a block diagram of a frequency modulation radio receiver that is activated by a tone frequency detector as known in the prior art, and that is deactivated by a tone phase shift detector in accordance with our invention. We have selected a frequency modulation receiver because such receivers are typically used with a continuous tone controlled squelch system (CTCSS). However, it is to be understood that it is possible to use our invention with other types of receivers. The receiver of FIG. 1 includes an antenna 9 for receiving the frequency modulated radio signals. These signals are amplified by a radio frequency (RF) amplifier 10, and supplied to a mixer 11. The mixer 11 receives signals from an oscillator 12 to produce intermediate frequency (IF) signals which are amplified in an IF amplifier 13 and supplied to an amplitude limiter 14. The amplitude limited signals are applied to a detector or discriminator 15 which produces audio signals that are amplified in an amplifier 16 and utilized in any suitable way, such as by a loudspeaker 17. Where, as contemplated here, the modulation signals include a continuous activating audio tone, the audio amplifier 16 includes a tone reject filter which blocks the activating tone frequencies, typically below 250 Hertz, so that they will not be supplied to the loudspeaker 17. The discriminator 15 also provides the audio signals to a noise squelch circuit 18. Typically, the noise squelch circuit 18 includes a noise filter network which has a passband above the audio frequency band, and which produces a squelch signal whenever the received noise level rises above a selected threshold because of the absence of an information signal. This squelch signal is applied to an appropriate point in the audio amplifier 16 to squelch or mute the audio amplifier 16 in response to noise. However, when a carrier signal is received, the noise squelch circuit 18 produces an unsquelch signal which opens the audio amplifier 16 so that information signals can be heard.

In a radio CTCSS, it is desirable or necessary, from either the standpoint of privacy or reduction of interference, to activate only selected radio receivers in response to transmissions on a given radio frequency, although other receivers in the system may be tuned to and receive that same audio frequency. This is achieved by the use of a continuous tone which is transmitted with the information signals, but which has frequencies below the information signal frequencies. In the case of a system providing radio telephone communication, the continuous tone transmitted is at a selected frequency generally in the range between 60 and 250 Hertz. The particular tone frequency transmitted activates only selected radio receivers, since such selected receivers are arranged to be responsive to that particular tone frequency. Such receivers usually require an unsquelch signal from the noise squelch circuit 18 and the presence of tone of the proper frequency in order for the audio amplifier 16 to be unsquelched and information (usually voice) signals heard or utilized. Accordingly, the discriminator 15 also supplies the audio signals to a voice reject filter 19 which is a lowpass filter that rejects the voice frequencies (generally above the assumed 250 Hertz), and passes only the low frequency tones. These tones are amplified by an amplifier 20, amplitude limited in a limiter 21, and supplied to a tone frequency detector 22. In tone activated receivers, the detector 22 must have a very narrow passband (such as + or −0.5 percent which would only be several Hertz) in order to insure that the receiver responds only to the desired tone frequency. The detector 22 produces an activating signal in response to the desired tone frequency, and this activating signal is applied to the audio amplifier 16 in addition to the signal from the noise squelch circuit 18. In the receiver, it is usually preferable that both the unsquelch signal from the noise squelch circuit 18 and the activating signal from the circuit 22 be present before the receiver can produce audio signals.

Figure 2:
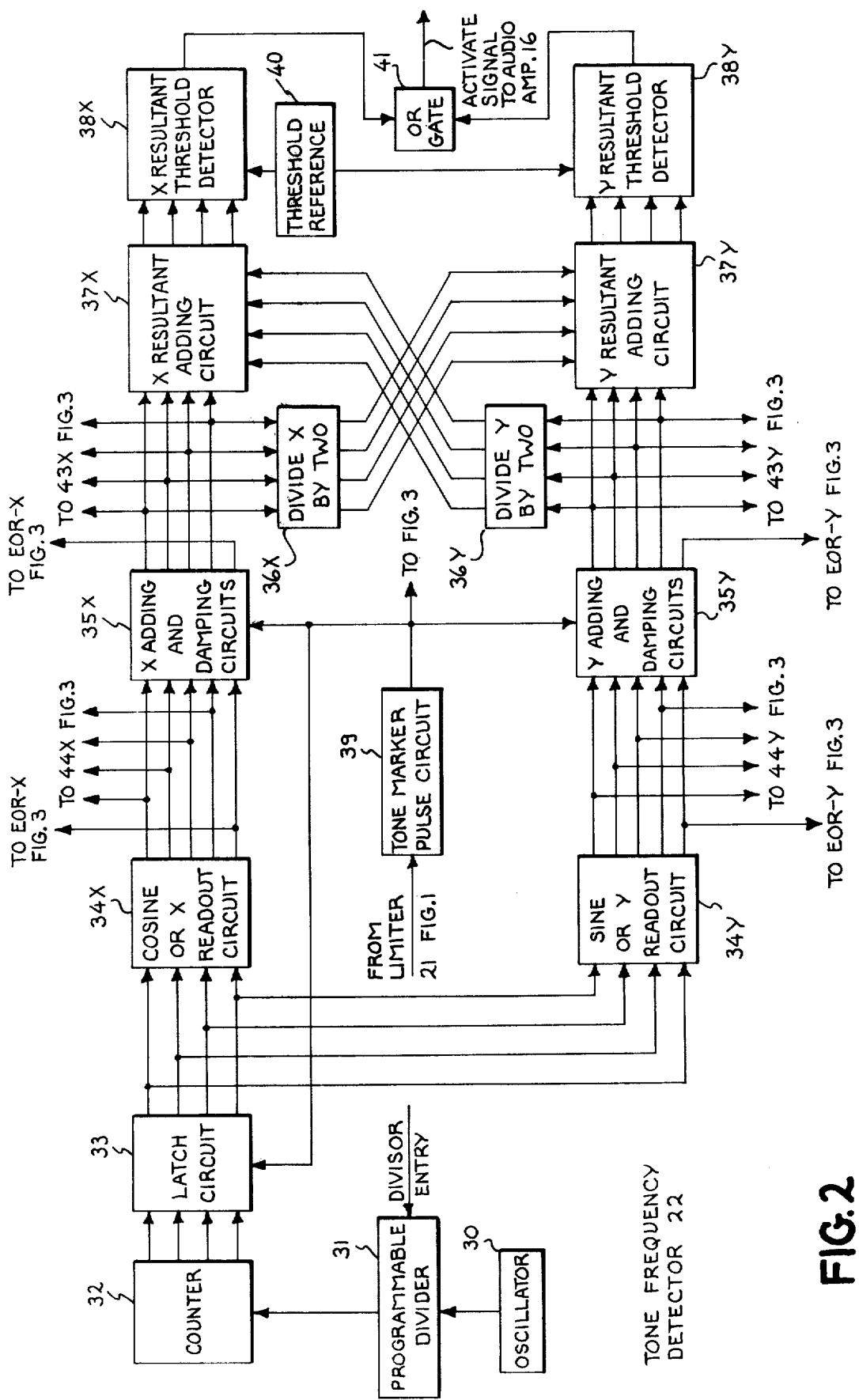
FIG. 2 shows a prior art example of a tone frequency detector used in the receiver of FIG. 1.

FIG. 2 shows a schematic block diagram of the tone frequency detector 22 with which our invention is intended to operate. The detector 22 is described in detail in U.S. Pat. No. 3,962,645, to which reference is hereby made. However, a brief description of the detector 22 will be given so that our invention can be more readily understood. The detector includes an oscillator 30 which produces relatively high frequency pulses preferably at a rate of 1,185,184 Hertz. This rate is preferred because it can be divided by a programmable divider 31 to produce N (preferably 16) pulses for each cycle of the tone frequency to be detected. Thus, if the tone frequency to be detected is 77 Hertz, then the divider 31 should produce 16 times 77 or 1232 pulses per second. The 1232 pulse rate can be obtained by dividing the 1,185,184 pulse rate by 962. The 1232 pulses per second are serially applied to a four output binary counter 32 which is known in the art, and whose parallel outputs have 16 binary states from 0000 to 1111 in response to the applied pulses. These 16 binary states represent 16 vector signals, each of which is spaced 22.5 degrees from adjacent vectors to total 360 degrees. The four outputs of the counter 32 are applied to a four input latch circuit 33 which is also known in the art. The latch circuit 33 has four parallel binary outputs which take the same logic state as the four binary inputs when a latch signal is applied. This latch signal is a tone marker pulse derived from a suitable circuit 39 which is connected to the limiter 21 of FIG. 1. The tone marker pulse circuit 39 produces a pulse that indicates the frequency of the received tone, and may be produced at a suitable but identical time point in each cycle of the tone. Typically, this time point is at the zero crossing of the tone signal in the positive direction. When the latch signal is applied to the latch circuit 33, it causes the four outputs of the latch circuit 33 to assume the logic condition of its four inputs, and to maintain this condition until latch signal is applied. Thus, the latch circuit 33 produces a binary number corresponding to the pulse number in each pulse sequence. Each binary number produced corresponds with the selected time point in each cycle of the tone marker pulse.

The binary number in each sequence that coincides with the tone marker pulse is converted to information representing a respective one of the 16 vector signals. These vector signals are more easily handled if they are resolved into their cosine (or X) components and their sine (or Y) components. Such components can be added or subtracted numerically, and a resultant obtained. These components are obtained from a cosine or X readout circuit 34X and a sine or Y readout circuit 34Y. The circuits 34X, 34Y may simply be memories which produce an output representative of the cosine and sine values called for by their inputs. Five lines are shown at the outputs of the circuits 34X, 34Y. Four of these lines represent (in binary coded form) the cosine and sine values, and the fifth line represents the sign (ie +or−) of the values.

The outputs from the readout circuits 34X, 34Y are respectively applied to X and Y adding and damping circuits 35X, 35Y which add or substract (depending on the sign) the outputs from the readout circuits 34X, 34Y, and keep a running total of these outputs. If the adding portions of the circuits 35X, 35Y had an unlimited capacity, their sums would continue to be added indefinitely. However, for practical reasons, this sum is limited by suitable damping or averaging circuits. The damping circuits may take a number of forms, one of which is that each additional value is reduced by one-sixteenth of the total in the respective adding circuit. After at least 16 values have been received, the total in the adding circuit is approximately equal to the value added so that an average of all previously added values is provided. Damping or averaging can also be achieved by fractional multiplying arrangements, or by having an adding circuit which retains only a selected number of the more recent added values.

The outputs of the X and Y adding and damping circuits 35X, 35Y provide a sum of the X and Y components of the vector signals representing the coincidence of a point in the tone signal. The approximate resultants of the X and Y components are obtained in resultant circuits 37X, 37Y, each of which adds the damped values of its corresponding components from the circuits 35X, 35Y and one-half the damped values of the other components from the divide-by-two circuits 36X, 36Y. These added values are respectively applied to resultant threshold detectors 38X, 38Y, which have a common threshold reference circuit 40. If either of the threshold detectors 38X, 38Y has a value that exceeds the threshold supplied by the circuit 40, it produces an output which is passed by an OR gate 41 to produce an activate signal. This activate signal is applied to the audio amplifier 16 to permit the amplifier 16 to pass signals if the noise squelch circuit 18 produces an unsquelch signal.

The circuit as described thus far is known in the art. A more detailed explanation of this circuit, particularly with respect to production and utilization of the vector signals, can be found in the mentioned U.S. Pat. No. 3,962,645.

The Invention

Figure 3:
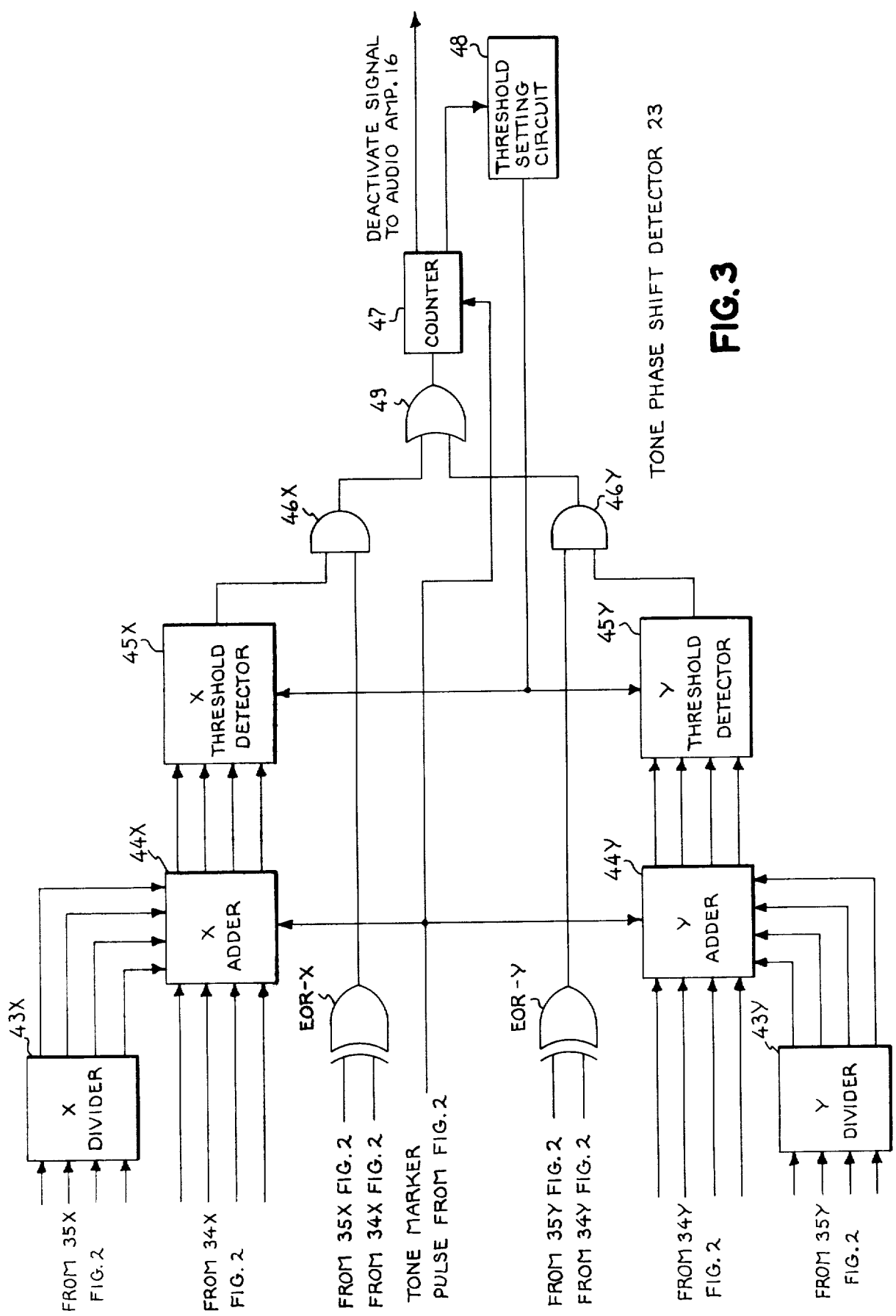
FIG. 3 shows a tone phase shift detector in accordance with our invention.

In order that the squelch tail or burst of noise at the end of a CTCSS radio transmission can be eliminated, the phase of the transmitted tone is shifted (typically by 135 degrees) after the microphone is unkeyed. The CTCSS transmitter includes a circuit that maintains the carrier with the phase shifted tone for about 175 milliseconds. When this phase shifted tone is received, a tone phase shift detector 23 is utilized to deactivate the audio amplifier 16 of FIG. 1 before the carrier is terminated. This prevents the squelch tail from being heard before the noise squelch circuit 18 can squelch the receiver. FIG. 3 shows a schematic block diagram of the tone phase shift detector 23 in accordance with our invention. Our detector 23 is intended to operate with vectors produced by the tone frequency detector 22. As will be explained in detail, our tone phase shift detector 23 produces a tone phase shift or deactivate signal when two conditions are met, namely:

1. The sum of either the X or Y vector component produced after a tone phase shift and the average X or Y vector component before the tone phase shift exceeds a predetermined magnitude or threshold; and 2. The sign of either the X or Y vector component produced after a tone phase shift differs from the sign of the average X or Y vector component before the tone phase shift.

These two conditions are utilized to insure that a sufficiently strong tone signal is received, and that the tone phase has in fact been shifted by the requisite amount, typically 135 degrees.

Our phase shift detector 23 of FIG. 3 includes two substantially identical parts, one for the X (or cosine) components of the vector signal and the other for the Y (or sine) components of the vector signal. With respect to the X components, an X divider 43X receives the four binary signals from the X adding and damping circuits 35X of FIG. 2 in parallel and divides these signals by some value, preferably 16, which is easy to achieve in binary circuits. These divided signals represent one-sixteenth of the averaged X vector components. The divided signals are applied in parallel to one set of inputs of an X adder circuit 44X. The other set of inputs to the X adder circuit 44X is derived in parallel from the cosine or X readout circuit 34X of FIG. 2. The two inputs, one the averaged and divided X components of previous vector signals and the other the X components of instantaneous vector signals, are added in response to each of the tone marker pulses from the circuit 39 of FIG. 2. In this addition, the numerical values to magnitudes are added without consideration as to their signs. For example, if the averaged and divided X component is +0.9239 and the instantaneous X component is −0.3827, the added inputs are 1.3066. The added inputs are applied to an X threshold detector 45X. If the added inputs exceed a threshold level, which may be varied, the X threshold detector 45X produces an output. The average sign of the signals in the X adding and damping circuit 35X and the instantaneous sign of the signals in the readout circuit 34X are applied to an exclusive OR gate EOR-X. Whenever these two signs are different, the gate EOR-X produces an output. When the two signs are the same (either both plus or both minus), the gate EOR-X produces no output. The output from the gate EOR-X along with the output from the threshold detector 45X are applied to an AND gate 46X. The output of the AND gate 46X is applied to one input of an OR gate 49. The output of the OR gate 49 is applied to a counter 47 which counts the number of outputs from the gate 49. If the counter 47 reaches a predetermined magnitude, a deactivate signal can be produced and applied to the audio amplifier 16 to deactivate this amplifier 16. The counter 47 is actuated to make a count in response to each tone marker pulse. We prefer that the counter 47 be of the type that is reset to zero if, during a tone marker pulse, there is no output from the gate 49. Another output is derived from the counter 47 and applied to a threshold setting circuit 48. The threshold setting circuit 48 is arranged to have an upper threshold when the count in the counter 47 is zero. As the count in the counter 47 increases, the threshold setting circuit 48 reduces the threshold, thus making it easier for the threshold detectors 45X, 45Y to produce an output.

The Y components have substantially similar circuits which have the corresponding reference numerals followed by a Y suffix. The outputs from the Y adding and damping circuits 35Y are applied to the Y divider 43Y, whose output is applied to the Y adder 44Y. The outputs from the Y readout circuit 34Y are applied directly to the adder 44Y. The outputs from the Y adder 44Y are applied to the Y threshold detector 45Y. The sign signals from the adding and damping circuit 35Y and from the readout circuit 34Y are applied to the exclusive OR gate EOR-Y. Outputs from the exclusive OR gate EOR-Y and the threshold detector 45Y are applied to the AND gate 46Y, whose output is applied to the other input of the OR gate 49.

Figure 4:
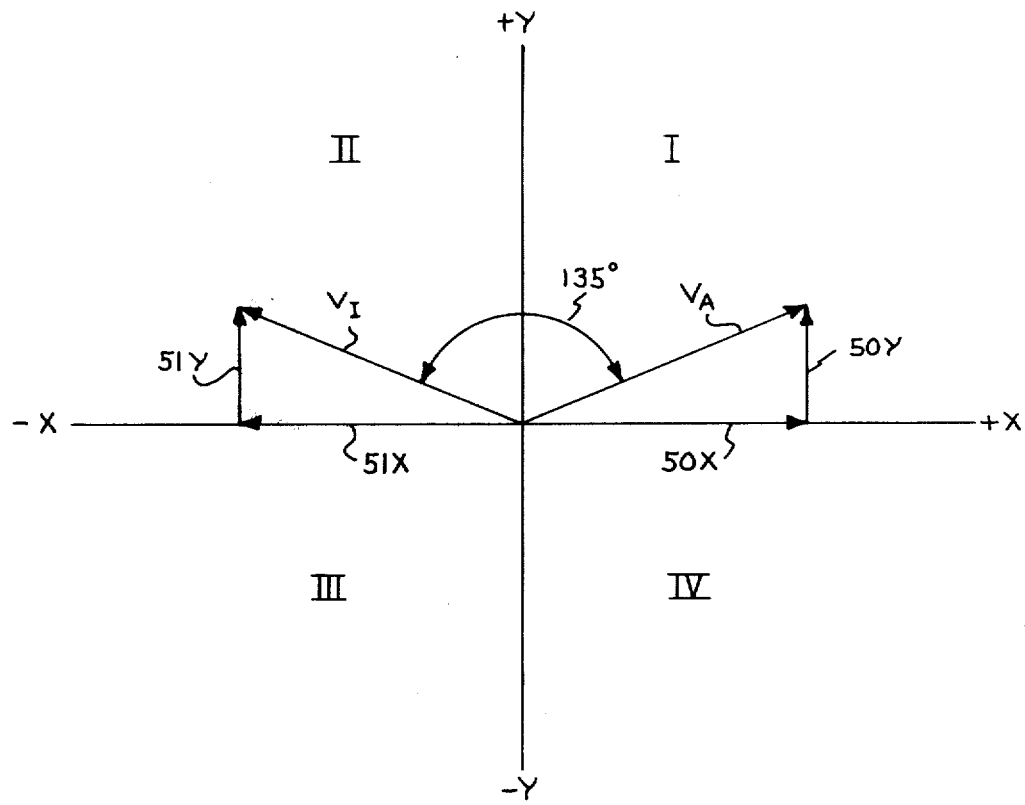
FIG. 4 shows a graph for explaining the principle of our tone phase shift detector.

FIG. 4 shows a graph in X and Y rectangular coordinates with four quadrants I, II, III, and IV for explaining the principle of our tone phase shift detector. In FIG. 4, we show a vector $V_A$ and its X and Y components 50X, 50Y from the adding and damping circuit 35X, 35Y after they have been divided by the dividers 43X, 43Y. This vector $V_A$ is the resultant vector which would be produced during transmission of the continuous tone after its X and Y components have been added over a number of tone cycles and then divided. We have assumed that the vector $V_A$ has the magnitude shown, and has an angular direction or phase of +22.5 degrees with respect to the X and Y coordinates. The exact amount by which the vectors (actually their X and Y components) are divided by the dividers 43X, 43Y depends upon the number of vectors added or included in the outputs of the adding and damping circuits 35X, 35Y. If, as we have assumed, the circuits 35X, 35Y produce components which are approximately 16 times as great as each subsequent component added, then the dividers 43X, 43Y divide by 16 to normalize or make their outputs approximately equal to each subsequent component received. In accordance with the above mentioned U.S. Pat. No. 3,962,645, this averaged and divided vector $V_A$ causes an activate signal to be provided. At the end of a transmission, the phase of the tone is shifted (135 degrees is typical) and transmitted for a short time thereafter. For a properly operating receiver, this phase shift is indicated by the instantaneous vector $V_I$ which is displaced by 135 degrees as shown in quadrant II of FIG. 4. This vector $V_I$ is produced for each cycle of the phase shifted tone. In FIG. 4, it will be noted that its X component 51X is negative, and that its Y component 51Y is positive. If the magnitude of the X component 51X of the vector $V_I$ added to the magnitude of the X component 50X of the vector $V_A$ is sufficiently great, the X threshold detector 45X produces an output. If the magnitude of the Y component 51Y of the vector $V_I$ added to the magnitude of the Y component 50Y of the vector $V_A$ is sufficiently great, the Y threshold detector 45Y produces an output.

Since the sign of the X component 51X of the vector $V_I$ is negative and the sign of the X component 50X of the vector $V_A$ is positive, the gate EOR-X will produce an output. Assuming that the X threshold detector 45X produces an output, the AND gate 46X produces a count output which is passed by the OR gate 49 and registered in the counter 47 at the time the tone marker pulse is received. On the next production of the vector $V_I$, another count will be registered. It will be recognized that each added vector $V_I$ decreases the magnitude of the vector $V_A$ and causes it to swing toward the position of the vector $V_I$. However, because the vector $V_A$ is an average, it will take a number of the vectors $V_I$ to cause the average vector $V_A$ to coincide with the position of the vector $V_I$. We have arranged our counter 47 to produce a deactivate signal at some count less than 16 but more than one, for example 6. And because each added instantaneous vector $V_I$ reduces the magnitude of the average vector $V_A$, we prefer that the threshold setting circuit 48 produce a lower threshold upon each occurrence of a count. Thus, we operate our threshold detectors 45X, 45Y against a threshold that starts from a maximum and decreases as each count is produced. We also prefer that our counter 47 be arranged to reset to zero if, upon receipt of the tone marker pulse, no output is supplied by the OR gate 49. This increases the security of our tone phase shift detector.

With respect to the Y components 50Y, 51Y of the vectors $V_A$, $V_I$ in FIG. 4, they are both positive so that the gate EOR-Y does not produce an output. Hence, even if the Y threshold detector 45Y produces an output the AND gate 46Y does not produce an output, and does not cause the counter 47 to count. Depending upon the vector angles, it is possible that both threshold detectors 45X, 45Y can produce an output at the same marker pulse. However, the counter 47 will register only one count, since it has only a single input from the OR gate 49.

Figure 5:
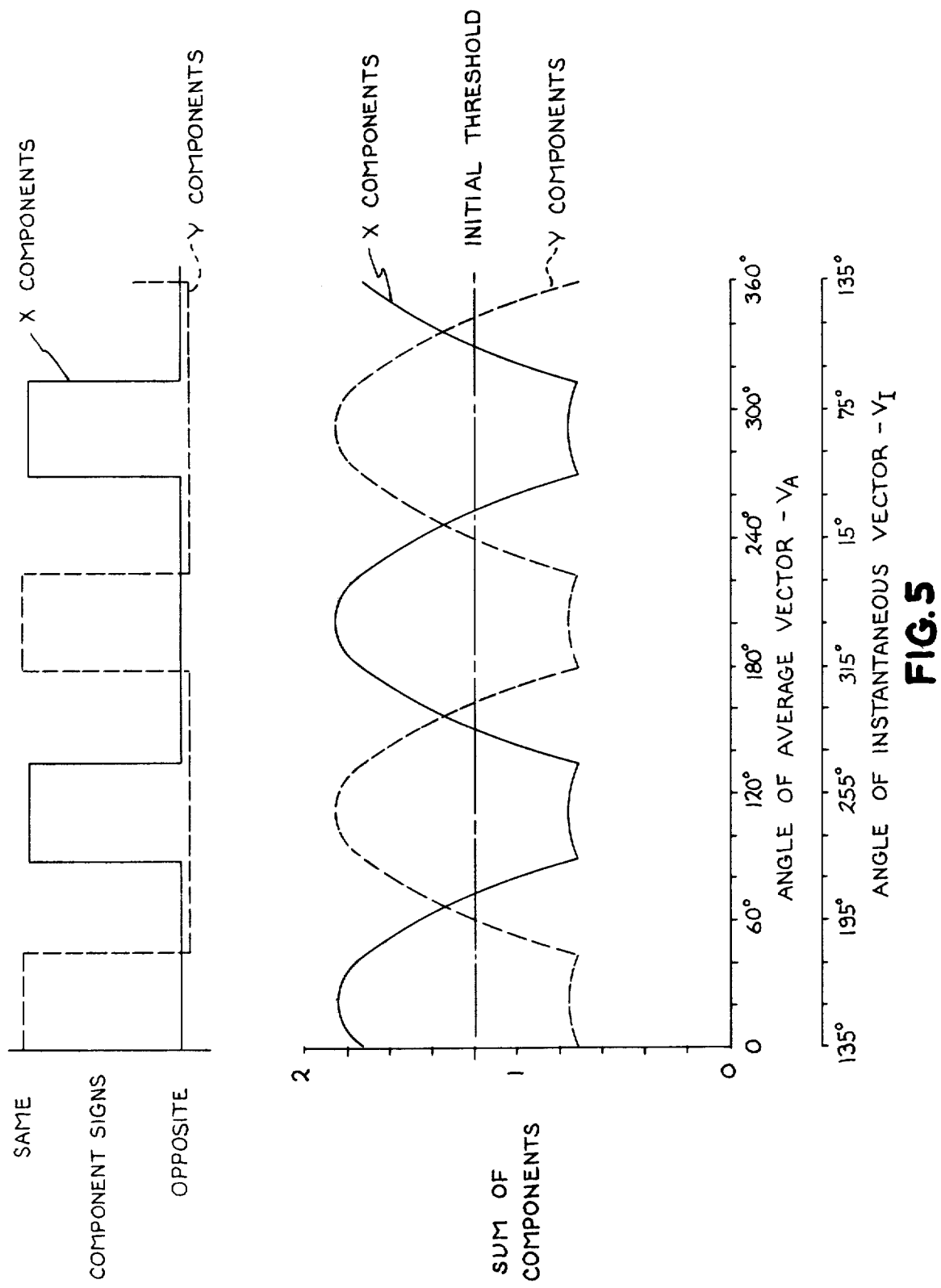
FIG. 5 shows a graph for explaining the operation of our tone phase shift detector.

This operation can be better understood by reference to FIG. 5. The upper graphs of FIG. 5 show how the signs of the X and Y components of the vectors $V_A$ and $V_I$ of FIG. 4 vary for all angular positions (relative to the X and Y coordinates) of these two vectors $V_A$ and $V_I$ with their fixed or substantially fixed 135 degree relation. The lower graphs of FIG. 5 show how the sum of the X components and the sum of the Y components vary for the angular positions of the vectors $V_A$ and $V_I$ with their fixed 135 degree relation. The two lower horizontal lines of FIG. 5 show the angle of the average vector $V_A$ and the angle of the instantaneous vector $V_I$ with respect to the +X coordinate. It will be noted that the angular designations have a 135 degree relation. The sums of the two components are calculated as follows:

$$X \text{ sum} = |\cos \angle V_A| + |\cos \angle V_I| \quad \text{(Equation 1)}$$

$$Y \text{ sum} = |\sin \angle V_A| + |\sin \angle V_I| \quad \text{(Equation 2)}$$

In these equations, $\angle V_A$ is the angle of the vector $V_A$ with the +X axis, and the $\angle V_I$ is the angle of the vector $V_I$ with the +X axis. In these calculations, the sums are the absolute numerical sums without taking the signs into consideration or effect. Several sample calculations will illustrate how these equations produce the X and Y component sums shown in FIG. 5. For an average vector angle of zero and an instantaneous vector angle of 135 degrees, the X sum is cos 0 degrees + cos 135 degrees, or 1.0+0.7071 (even though the cosine of 135 degrees is minus), which is 1.7071. The Y sum is sin 0 degrees + sin 135 degrees, or 0.0+0.7071, or 0.7071. The sum of the X components is equal to the sum of the Y component at 67.5 degrees, and each 90 degrees thereafter. This sum is equal to cos 67.5 degrees + cos 202.5 degrees, or 0.3827+0.9239, or 1.3066. If the initial threshold of the circuits 48X, 48Y is set below this value, for example at 1.2, then either the X adder 44X or the Y adder 44Y should produce a component sum which exceeds this threshold, and either or both of the threshold detectors 45X, 45Y produce an output. If either the X components or the Y components have a different sign, as indicated by the exclusive OR gates EOR-X or EOR-Y, then a count will be registered in the counter 47. The relation of the component signs is shown in the upper part of FIG. 5. There, it will be seen that the X components have opposite signs for average vector angles from 0 to 90 degrees, 135 to 270 degrees, and 315 to 0 degrees. The Y components have opposite signs for average vector angles from 45 to 180 degrees, and 225 to 360 degrees. Thus, either the X components or the Y components should have opposite signs at any given average vector angle. Each time a tone marker pulse is received, the counter 47 should receive a count for an instantaneous vector $V_I$ having a phase shift of 135 degrees. As the respective counter counts upward, it preferably reduces the threshold level for its respective setting circuit so that its respective detector can continue to produce an output. This change in threshold can vary as desired, and any predetermined count can be utilized to produce a deactivate signal.

Figure 6:
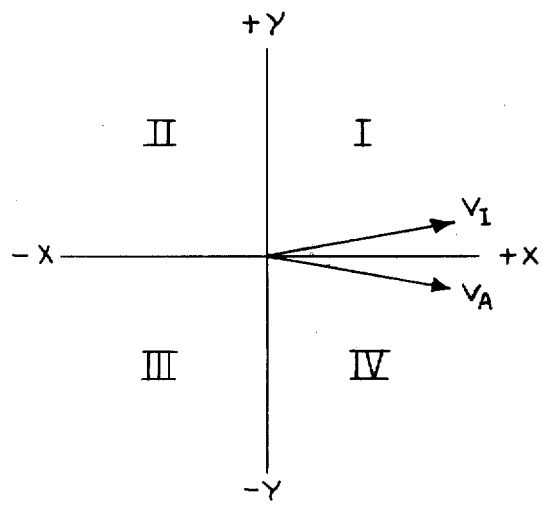
FIGS. 6 and 7 show graphs for further explaining the operation of our tone frequency detector.
Figure 7:
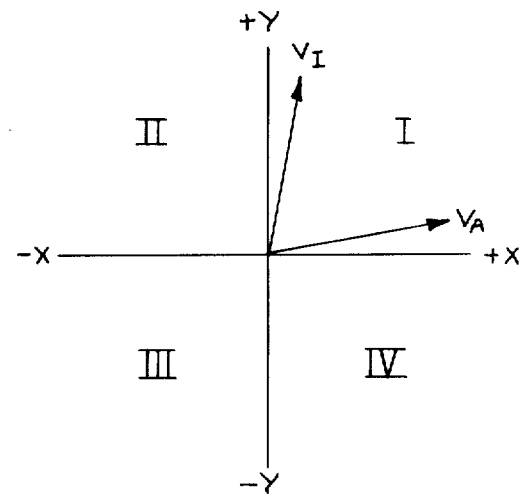

FIGS. 6 and 7 show relations for average and instantaneous vectors when, in accordance with our invention, a count would not be produced. In FIG. 6, it will be noted that the two vectors have X components which are relatively large, but whose signs are the same. Hence, no X count would be produced. The Y components have opposite signs, but their magnitudes are so small that the threshold detector would not produce an output. Hence, for the vectors in FIG. 6, no count would be registered, which is correct. In FIG. 7, the vectors have relatively large magnitudes, but a phase separation of less than 90 degrees. Hence, the signs of the X components are the same and the signs of the Y components are the same. Further, the Y component of the vector $V_A$ is fairly small so that the Y threshold detector would not produce an output. The X component of the vector $V_I$ is also relatively small so that the X threshold detector would not produce an output. Again, no count would be registered.

Conclusion

It will thus be seen that we have provided a new and improved tone phase shift detector for use with the tone frequency detector shown in the prior art and in FIG. 2. While we have shown only one embodiment, persons skilled in the art will appreciate the many modifications that may be made. First, instead of the parallel outputs for the various logic circuits, serial outputs could be utilized if they operate at sufficiently high speed and are properly clocked. The various signals may represent values in straight binary form, or in binary coded decimal form. With sufficient speed, only one of each type circuit would be required, each circuit time-dividing its operation between the X and Y components. In addition, the levels of the threshold detectors can be set as desired, and the number of required counts may be set as desired. Therefore, while our invention has been described with reference to a particular embodiment, it is to be understood that modifications may be made without departing from the spirit of the invention or from the scope of the claims.

What we claim as new and desire to secure by Letters Patent of the United States is:

1. In a receiver that detects the frequency of audio tones by repetitively producing vector signals each having an angular indication of the frequency of said tones, an improved circuit for detecting a phase shift in said audio tones comprising:
   a. first means for producing a first signal having a magnitude and angle representing an average of said vector signals;
   b. second means for producing a second signal in response to each of said vector signals, each of said second signals having a magnitude and angle representing each of said vector signals are produced;
   c. third means connected to said first and second means for producing a third signal in response to the sum of said first and second signal magnitudes exceeding a predetermined threshold;
   d. fourth means connected to said first and second means for producing a fourth signal in response to said first and second signals being in different angular quadrants;
   e. fifth means connected to said third and fourth means for producing a fifth signal in response to each simultaneous occurrence of said third and fourth signals;
   f. and output means connected to said fifth means for counting said fifth signals.

2. The improved circuit of claim 1 wherein said output means adds at the time each of said second signals is produced, and is reset to zero in the absence of a fifth signal at said time.

3. The improved circuit of claim 1 wherein said first signals have X and Y components, said second signals have X and Y components, said X and Y components have signs indicating their angular quadrants, said third means produce third X component signals in response to the sum of said first and second X component signal magnitudes exceeding a predetermined threshold and produce third Y component signals in response to the sum of said first and second Y component signal magnitudes exceeding a predetermined threshold, said fourth means produce fourth X component signals in response to said first and second X component signals having different signs and produce fourth Y component signals in response to said first and second Y component signals having different signs, and said fifth means produce a fifth signal in response to the simultaneous occurrence of each of said third and fourth X component signals or produce said fifth signal in response to the simultaneous occurrence of each of said third and fourth Y component signals.

4. The improved circuit of claim 3 wherein said output means counts at the time each of said second signals is produced, and is reset to zero in response to the absence of either of said fifth signals at said time.

5. In a radio receiver having means for producing a sequence of vector signals each of which has a phase that is related to the frequency of a tone detected by said receiver, and having means for adding said produced vector signals, an improved circuit for detecting a phase shift of said detected tone comprising:
   a. input means for said vector signals;
   b. means for averaging said added vector signals;
   c. means connected to said input means and to said averaging means for adding the magnitude of said averaged vector signals to the magnitude of each of said vector signals in said sequence;
   d. threshold means connected to said magnitude adding means for producing a threshold output signal in response to each added magnitude that exceeds a selected threshold;
   e. sign means connected to said input means and to said averaging means for producing a sign output signal in response to each of said vector signals in said sequence having a sign that is opposite to the sign of said averaged vector signals;
   f. counting means connected to said threshold means and to said sign means for producing a count signal in response to each simultaneous production of a threshold output signal and a sign output signal;
   g. and means connected to said counting means for producing a phase shift signal in response to a selected number of said count signals.

6. The improved circuit of claim 5 and comprising means connected between said counting means and said threshold means for lowering said threshold in response to each of said count signals.

7. The improved circuit of claim 5 wherein said counting means is operated in response to each cycle of said tone, and is reset to zero during said operation if either of said output signals applied thereto is absent.

8. The improved circuit of claim 7 and further comprising means connected between said counting means and said threshold means for lowering said threshold in response to each of said count signals.

9. The improved circuit of claim 8 wherein said vector signals are represented by X and Y components, and wherein said counting means produce count signals in response to each simultaneous production of a threshold output signal and a sign output signal for components of the same character.

10. An improved tone radio receiver comprising:
   a. first means for detecting said tone;
   b. second means connected to said first means for producing a marker signal in response to the same point in each cycle of said tone;
   c. third means connected to said second means for producing a vector signal in response to each marker signal, said vector signal having an angular direction indicative of the frequency of said tone;
   d. fourth means connected to said third means for producing an average of said vector signals;
   e. fifth means connected to said second, third and fourth means for adding the magnitude of said average of said vector signals produced by said fourth means to the magnitude of each vector signal produced by said third means in response to each of said marker signals, and producing a first signal in response to each added magnitude that exceeds a selected threshold;
   f. sixth means connected to said third and fourth means for comparing the angular relation of said average of said vector signals produced by said fourth means with each vector signal produced by said third means and producing a second signal in response to compared vectors having opposite signs;
   g. seventh means connected to said fifth and sixth means for producing a count signal in response to each simultaneous occurrence of said first signal and said second signal;
   h. and eighth means connected to said seventh means for producing a tone phase shift signal in response to a selected number of said count signals.

11. The improved receiver of claim 10 wherein said eighth means is reset to zero in response to the absence of a count signal during the occurrence of said marker signal.

* * * * *

UNITED STATES PATENT OFFICE
CERTIFICATE OF CORRECTION

Patent No. 4,171,516     Dated October 16, 1979

Inventor(s) Richard F. Challen; Terry N. Garner

It is certified that error appears in the above-identified patent and that said Letters Patent are hereby corrected as shown below:

Column 1, line 21, cancel "the" (second occurrence) and insert -- that --

Column 4, line 33, after "until" insert -- another --

Signed and Sealed this

Twenty-fifth Day of December 1979

[SEAL]

Attest:

SIDNEY A. DIAMOND

Attesting Officer     Commissioner of Patents and Trademarks